United States Patent
Kasai et al.

(10) Patent No.: US 12,119,142 B2
(45) Date of Patent: Oct. 15, 2024

(54) FILM, METHOD FOR PRODUCING FILM, METAL-CLAD LAMINATE, AND COATED METAL CONDUCTOR

(71) Applicant: AGC INC., Tokyo (JP)

(72) Inventors: Wataru Kasai, Tokyo (JP); Tomoya Hosoda, Tokyo (JP); Atsumi Mitsunaga, Tokyo (JP); Tatsuya Terada, Tokyo (JP); Sota Yuki, Tokyo (JP)

(73) Assignee: AGC INC., Tokyo (JP)

( * ) Notice: Subject to any disclaimer, the term of this patent is extended or adjusted under 35 U.S.C. 154(b) by 248 days.

(21) Appl. No.: 17/591,755

(22) Filed: Feb. 3, 2022

(65) Prior Publication Data

US 2022/0157487 A1 May 19, 2022

Related U.S. Application Data

(63) Continuation of application No. PCT/JP2020/031873, filed on Aug. 24, 2020.

(30) Foreign Application Priority Data

Aug. 27, 2019 (JP) .............................. 2019-154856
Sep. 26, 2019 (JP) .............................. 2019-175255
Feb. 18, 2020 (JP) .............................. 2020-025351

(51) Int. Cl.
*H01B 3/30* (2006.01)
*B32B 7/025* (2019.01)
(Continued)

(52) U.S. Cl.
CPC .............. *H01B 3/306* (2013.01); *B32B 7/025* (2019.01); *B32B 15/08* (2013.01); *B32B 15/20* (2013.01); *B32B 37/24* (2013.01); *H01B 1/026* (2013.01); *H01B 3/445* (2013.01); *B32B 2037/243* (2013.01); *B32B 2250/03* (2013.01);
(Continued)

(58) Field of Classification Search
CPC ....... B32B 15/08; B32B 15/088; B32B 15/09; B32B 15/14; B32B 15/18; B32B 15/20; B32B 27/08; B32B 27/281; B32B 27/285; B32B 27/286; B32B 27/288; B32B 27/304; B32B 27/34; B32B 37/36; B32B 37/0038; B32B 37/02; B32B 37/16; H05K 1/036; H05K 1/0366; H05K 3/022
See application file for complete search history.

(56) References Cited

U.S. PATENT DOCUMENTS

2016/0242274 A1* 8/2016 Hosoda .................. B32B 15/08
2020/0198310 A1 6/2020 Kasai et al.

FOREIGN PATENT DOCUMENTS

CN 1302317 A 7/2001
CN 101003716 A 7/2007
(Continued)

*Primary Examiner* — William H. Mayo, III
(74) *Attorney, Agent, or Firm* — Element IP, PLC

(57) ABSTRACT

A heat-resistant film that has high adhesion and low warping, a method for producing the film, and a metal-clad laminate and a coated metal conductor, using the film. The film includes an aromatic polyimide base film, and a layer containing a polymer having units based on tetrafluoroethylene and units based on a perfluoro(alkyl vinyl ether) and an aromatic polymer, formed on each side of the base film.

14 Claims, 1 Drawing Sheet

(51) Int. Cl.
*B32B 15/08* (2006.01)
*B32B 15/20* (2006.01)
*B32B 37/24* (2006.01)
*H01B 1/02* (2006.01)
*H01B 3/44* (2006.01)

(52) U.S. Cl.
CPC ....... *B32B 2250/40* (2013.01); *B32B 2255/10* (2013.01); *B32B 2255/26* (2013.01); *B32B 2270/00* (2013.01); *B32B 2307/202* (2013.01); *B32B 2307/206* (2013.01); *B32B 2307/7265* (2013.01); *B32B 2457/04* (2013.01)

(56) References Cited

FOREIGN PATENT DOCUMENTS

| | | | | |
|---|---|---|---|---|
| JP | H09-157418 A | | 6/1997 | |
| JP | 107107475 A | * | 8/2017 | ............... H05K 1/03 |
| JP | WO 2017-222027 A | * | 12/2017 | ............. H05K 1/036 |
| TW | 201922452 A | | 6/2019 | |
| WO | WO-2015080260 A1 | | 6/2015 | |

\* cited by examiner

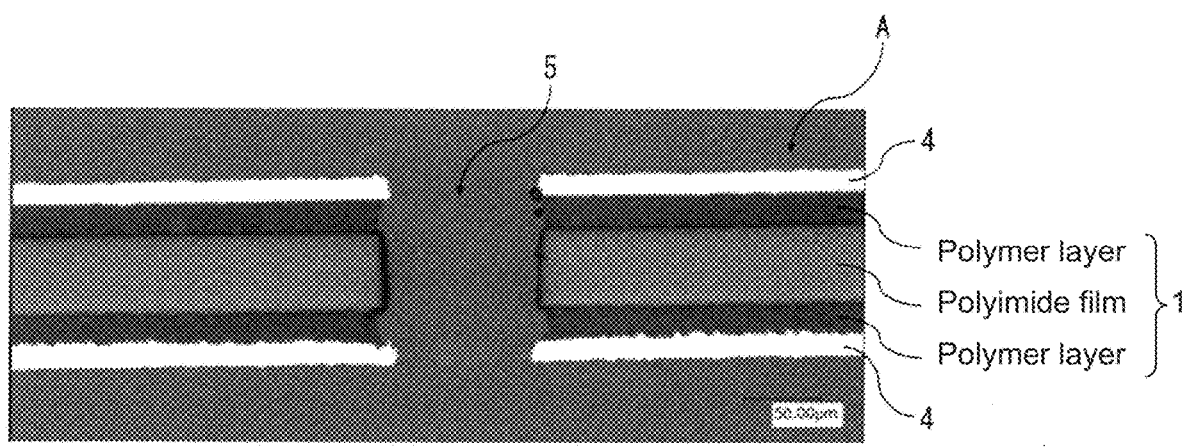

FILM, METHOD FOR PRODUCING FILM, METAL-CLAD LAMINATE, AND COATED METAL CONDUCTOR

This application is a continuation of PCT Application No. PCT/JP2020/031873, filed on Aug. 24, 2020, which is based upon and claims the benefit of priorities from Japanese Patent Application No. 2019-175255 filed on Sep. 26, 2019, Japanese Patent Application No. 2020-025351 filed on Feb. 18, 2020 and Japanese Patent Application No. 2019-154856 filed on Aug. 27, 2019. The contents of those applications are incorporated herein by reference in their entireties.

TECHNICAL FIELD

The present invention relates to a film comprising an aromatic polyimide base film and a predetermined polymer layer containing a tetrafluoroethylene polymer and an aromatic polymer on each side of the base film, a method for producing it, and a metal-clad laminate and a coated metal conductor, using the film.

BACKGROUND ART

A three-layered film comprising a polyimide film as a base film and a layer of a tetrafluoroethylene polymer (TFE polymer) formed on each side of the polyimide film has been known (Patent Document 1).

A polyimide is an engineering plastic excellent in forming properties and mechanical properties, and a TFE polymer is particularly excellent in electrical properties and heat resistance, and accordingly the three-layered film is useful as a material to be used in high-end electric/electronic fields, e.g. for printed circuit boards and electric wire covering.

Further, Patent Document 2 proposes a means to form a layer in such a film from a powder dispersion containing a powder of a TFE polymer.

PRIOR ART DOCUMENTS

Patent Document

Patent Document 1: WO2015/080260
Patent Document 2: JP-A-H09-157418

DISCLOSURE OF INVENTION

Technical Problem

The present inventors have conducted use of a polymer (PFA polymer) having units based on tetrafluoroethylene and units based on a perfluoro(alkyl vinyl ether), having a high melting temperature and being excellent in heat resistance, so as to expand the range of use of the film (e.g. use in a high temperature region such as in solder reflow process). They have found that the three-layered film obtainable from such a polymer is likely to be warped and its dimensional stability is likely to lower, and that the layer of the PFA polymer and the polyimide film are likely to separate.

They have further found that when the obtained three-layered film is bonded to other substrate, the adhesion is still insufficient, and particularly at a high temperature region, the adhesion is likely to deteriorate. They have further found that if the layer is increased with a view to adjusting physical properties (particularly electrical properties) of the TFE polymer, such problems become more remarkable.

Under these circumstances, the present inventors have conducted extensive studies to overcome the above problems and as a result, have found that in a film having an aromatic polyimide base film and a PFA polymer layer, by incorporating an aromatic polymer into the PFA polymer layer, warpage of the film can favorably be suppressed. They have further found that by incorporating an aromatic polymer, not only the adhesion between the layer and the aromatic polyimide film will further improve but also properties of the film, including optical properties such as UV absorption and mechanical properties such as folding property, improve, and a film with a high degree of freedom of constitution can be obtained.

The present invention is achieved by the above discoveries, and its object is to provide a film which is excellent in heat resistance, which is less likely to be warped and which has high adhesion, a method for producing it, and a metal-clade laminate and a coated metal conductor, using the film.

Solution to Problem

The present invention provides the following.

[1] A film comprising an aromatic polyimide base film, and a layer containing a polymer having units based on tetrafluoroethylene and units based on a perfluoro(alkyl vinyl ether) and an aromatic polymer, formed on each side of the base film.

[2] The film according to [1], wherein the base film and each layer are directly in contact with each other.

[3] The film according to [1] or [2], wherein the polymer is a polymer having units based on tetrafluoroethylene and units based on a perfluoro(alkyl vinyl ether), and having a polar functional group, or a polymer having units based on tetrafluoroethylene and units based on a perfluoro(alkyl vinyl ether) in a proportion of the units based on a perfluoro(alkyl vinyl ether) of from 2.0 to 5.0 mol % to all units, and having no functional polar group.

[4] The film according to any one of [1] to [3], wherein the aromatic polymer is an aromatic polyimide.

[5] The film according to any one of [1] to [4], wherein polar functional groups are present at the surface of the layer.

[6] The film according to any one of [1] to [5], wherein the film has a thickness of 25 μm or more, and the ratio of the total thickness of the two layers to the thickness of the base film is 1 or more.

[7] The film according to any one of [1] to [6], wherein in the layer, the amount of the aromatic polymer to the total amount of the polymer and the aromatic polymer is 10 mass % or less.

[8] The film according to any one of [1] to [7], which has a water absorption coefficient of 0.1% or lower.

[9] The film according to any one of [1] to [8], which has an optical absorption coefficient at a wavelength of 355 nm of 50% or higher.

[10] The film according to any one of [1] to [9], which has a loss tangent of less than 0.003.

[11] A method for producing a film, which comprises applying a powder dispersion containing a powder of a polymer having units based on tetrafluoroethylene and units based on a perfluoro(alkyl vinyl ether), an aromatic polymer or its precursor, and a liquid medium, to the surface of an aromatic polyimide base film, followed by heating to form a layer, thereby to obtain a film having the layer formed on each side of the base film.

[12] The production method according to [11], wherein the powder dispersion further contains a thermally decomposable nonionic surfactant.
[13] The production method according to [11] or [12], wherein heating is conducted in an atmosphere containing an oxygen gas to form the layer.
[14] A metal-clad laminate, comprising the film as defined in any one of [1] to [11], and a metal foil bonded to each side of the film.
[15] A coated metal conductor, comprising a metal conductor, and the film as defined in any one of [1] to [11] formed to coat the metal conductor.

Advantageous Effects of Invention

According to the present invention, a film which is excellent in heat resistance, which is less likely to be warped and which has high adhesion, and a metal-clad laminate and a coated metal conductor using the film, are provided.

BRIEF DESCRIPTION OF DRAWINGS

FIG. 1 is a microscopic photograph of a cross section around a through hole in a double sided copper clad laminate obtained from film 1.

DESCRIPTION OF EMBODIMENTS

The following terms have the following meanings.

The "yield strength" means a stress corresponding to the yield point at which the strain remains even after the stress is removed, since the strain and stress are not proportional to each other any more as the strain becomes large, and is defined by the value of the "stress at 5% elongation" when the elastic modulus in tension of the base film is measured in accordance with ASTM D882.

The "hard plastic deformation" means a property that the stress increases when the base film is plastically deformed or a property that the stress required is large when the base film is plastically deformed, and is defined by the value of the "stress at 15% elongation" when the elastic modulus in tension of the base film is measured in accordance with ASTM D882.

The "tetrafluoroethylene polymer" is a polymer having units based on tetrafluoroethylene and is sometimes referred to as simply as "TFE polymer".

"D50 of the powder" is a particle size at which the cumulative volume is 50% on a cumulative curve obtained by measuring the particle size distribution of the powder by laser diffraction scattering method and taking the entire volume of the group of particles constituting the powder (hereinafter sometimes referred to as "powder particles") 100% (that is volume basis cumulative 50% size).

"D90 of the powder" is the volume basis cumulative 90% size of the powder measured in the same manner.

"D50 and D90" are values measured by a laser diffraction scattering particle size distribution measuring apparatus (manufactured by HORIBA, Ltd., LA-920 measurement apparatus) by dispersing the powder in water.

The "melt viscosity of the polymer" is a value measured by holding a sample (2 g) of the polymer preliminarily heated at the measurement temperature for 5 minutes, under a load of 7 MPa at the measurement temperature, using a flow tester and a 2φ-8 L die in accordance with ASTM D1238.

The "melting temperature (melting point) of the polymer" is a temperature corresponding the maximum value of the melting peak of the polymer measured by differential scanning calorimetry (DSC).

The "glass transition point of the polymer" is a value measured by analyzing the polymer by dynamic mechanical analysis (DMA).

The "viscosity of the powder dispersion" is a value measured with respect to the powder dispersion at room temperature (25° C.) at a number of revolutions of 30 rpm using a B viscometer. Measurement is conducted three times and the average of the three measured values is taken.

The "elastic modulus in tension of the film" is a value measured by a wide viscoelasticity measurement apparatus at a measurement frequency of 10 Hz.

The "units" of a polymer may be an atom group directly formed from a monomer by polymerization or may be an atom group having a structure of a polymer obtained by polymerization partly converted by a predetermined treatment. Units based on a monomer A will sometimes be referred to as monomer A units.

The "ten point height of roughness profile (Rzjis) on the surface of a metal foil" is a value specified by JIS B 0601:2013, Annex JA.

The film of the present invention comprises an aromatic polyimide (hereinafter sometimes referred to as "aromatic PI") base film, and a layer containing a polymer (hereinafter sometimes referred to as "PFA polymer") having units based on tetrafluoroethylene (TFE units) and units based on a perfluoro(alkyl vinyl ether) (PAVE units) and an aromatic polymer (hereinafter sometimes referred to as "AR polymer"), formed on each side of the base film.

The PFA polymer has a high melting temperature and is excellent in heat resistance as compared with a polymer (FEP) having TFE units and units based on hexafluoropropylene, which is the same TFE polymer. However, the PFA polymer has a high linear expansion coefficient, and its formed product (e.g. polymer layer) is likely to be warped. Further, although the PFA polymer has high flexibility, it is considered to have a low adhesion to other substrates, and its formed product is less likely to be bonded to other substrates.

Whereas, the film of the present invention is less likely to be warped and has improved heat resistance even though it employs the PFA polymer. This is considered to be because the polymer layer formed on one side of the base film offsets warpage of the polymer layer on the other side to a certain extent. However, according to the studies by the present inventors, this is not sufficient to suppress warpage of the film, and the layer and the base film are likely to be separated. Further, the bonding property to other substrates is still insufficient.

The present inventors have found that by incorporating the AR polymer into the polymer layer, a heat resistant film (film of the present invention) which has warpage and separation sufficiently suppressed, which has improved bonding property to other substrates, and which highly exhibits physical properties (particularly electrical properties) of the TFE polymer, can be obtained. This is considered to be because the AR polymer highly dispersed in the polymer layer relaxes the linear expansion of the polymer layer, and because the aromatic rings of the AR polymer present in the surface layer of the polymer layer interact with one another. Specifically, the aromatic rings in the AR polymer and the aromatic rings in the aromatic PI, present in the vicinity of the interface between the polymer layer and the base film undergo stacking, whereby the adhesion of the polymer layer to the base film improves.

The absolute value of the linear expansion coefficient of the film of the present invention is preferably 30 ppm/° C. or lower, more preferably 20 ppm/° C. or lower, further preferably 10 ppm/° C. or lower. In such a case, regardless of e.g. the temperature of the atmosphere in which the film is placed, warpage of the film can effectively be suppressed. The lower limit of the absolute value of the linear expansion coefficient of the film is 0 ppm/° C.

The peel strength of the film of the present invention is preferably 10 N/cm or more, more preferably 15 N/cm or more, further preferably 20 N/cm or more. In such a case, the film can suitably be used as a printed board material or a metal conductor coating material (e.g. an electrical wire coating material). The upper limit of the peel strength of the film is 100 N/cm.

Further, the film of the present invention has high ultraviolet (UV) absorption and is suitable for processing by laser such as UV-YAG laser. This is considered to be because the AR polymer is highly dispersed in the polymer layer to form a certain type of matrix and at the same time to be uniformly distributed, whereby favorable UV absorption of the aromatic rings which the AR polymer is achieved.

On the film, via holes having a favorable shape can easily be formed by laser processing, and accordingly the film can be suitably used particularly as a printed board material.

The film of the present invention has an optical absorption coefficient at a wavelength of 355 nm of preferably 50% or higher, more preferably 75% or higher, further preferably 90% or higher. The upper limit of the optical absorption coefficient is 100%.

The optical absorption coefficient at a wavelength of 355 nm of the film can be measured by a spectrophotometer (manufactured by Shimadzu Corporation, "UV-3600").

Further, the film of the present invention has low water absorption (high water barrier property). This is considered to be because the polymer layers and the base film are present independently of one another, not as an integrated product having the polymer layers and the base film compatible with one another, and accordingly the low water absorption of the PFA polymer complements the high water absorption of the aromatic PI.

The water absorption coefficient of the film is preferably 0.1% or lower, more preferably 0.07% or lower, further preferably 0.05% or lower. In such a case, the film is less likely to transmit water vaper and exhibits excellent insulating properties over a long period of time, and is thereby useful particularly as a metal conductor coating material. The lower limit of the water absorption coefficient of the film is 0%.

The water absorption coefficient of the film is obtained in accordance with ASTM D570. Specifically, the film is preliminarily dried at 50° C. for 48 hours and dipped in pure water at 23° C. for 24 hours, and the water absorption coefficient is obtained in accordance with the following formula from the mass of the film before and after dipping in pure water.

Water absorption coefficient (%) = (mass after dipping in water − mass after preliminary drying)/mass after preliminary drying × 100

The base film in the present invention preferably has high yield strength. Specifically, the stress at 5% elongation of the base film is preferably 180 MPa or more, more preferably 210 MPa or more. The stress at 5% elongation is preferably 500 MPa or less.

Further, the base film in the present invention is preferably hardly plastically deformable. Specifically, the stress at 15% elongation of the base film is preferably 225 MPa or more, more preferably 245 MPa or more. The stress at 15% elongation is preferably 580 MPa or less.

When the base film of the present invention has high yield strength, particularly when it is hardly plastically deformable, the absolute value of the linear expansion coefficient of the film of the present invention can be made sufficiently low, and warpage can be more securely prevented.

The elastic modulus in tension at 320° C. of the base film is preferably 0.2 GPa or higher, more preferably 0.4 GPa or higher. The elastic modulus in tension is preferably 10 GPa or lower, more preferably 5 GPa or lower.

In such a case, the film of the present invention is excellent in handling efficiency when heated or cooled at the time of processing. That is, when the elastic modulus in tension of the base film is the above lower limit or more, shrinkage of the polymer layer will be effectively relaxed by elasticity of the base film when heated or cooled at the time of processing, and the film is less likely to have wrinkles, and the obtainable product is likely to have improved physical properties (e.g. surface smoothness). Such tendency is remarkable when the polymer layer has a high PFA polymer content or is thick. Further, when the elastic modulus in tension of the base film is the above upper limit or less, flexibility of the film of the present invention is more likely to be high.

The imide group density of the aromatic PI constituting the base film is preferably from 0.20 to 0.35, When the imide group density is the above upper limit or lower, the water absorption coefficient of the base film tends to be lower, and changes of the dielectric properties of the film of the present invention are more likely to be suppressed. When the imide group density is the above lower limit or higher, the imide groups function as polar groups and not only adhesion between the base film and the polymer layer further improves but also the water absorption coefficient tends to be remarkably decreased.

Further, when the imide group density is within the above range, at the time of processing of the film of the present invention, the film hardly has wrinkles. The wrinkles are likely to form when the aromatic PI in the base film has a low glass transition point.

The imide group density is a value obtained by dividing the molecular weight (140.1) of the imide group moiety per unit, in a polyimide obtained by imidizing the polyimide precursor, by the molecular weight of the polyimide per unit. For example, in the case of a polyimide (molecular weight per unit: 382.2) obtained by imidizing a polyimide precursor comprising two components of one molecule of pyromellitic dianhydride (molecular weight: 218.1) and 1 mol of 3,4-oxydianiline (molecular weight: 200.2), the imide group density is obtained by dividing 140.1 by 382.2, that is 0.37.

The aromatic PI is a polyimide containing an aromatic group in its repeating units, and may, for example, be an aromatic polyimide obtained by reacting a diamine and a carboxylic acid dianhydride to synthesize a polyamic acid, and imidizing the polyamic acid by thermal imidization or chemical imidization.

The solvent for synthesis of the polyimide acid may be N,N-dimethylformamide, N,N-dimethylacetamide or N-methyl-2-pyrrolidone.

The diamine may, for example, be 4,4'-diaminodiphenylpropane, 4,4'-diaminodiphenylmethane, 4,4'-oxydianiline, 3,3'-oxydianiline, 3,4'-oxydianiline, 4,4'-diaminodiphenyldiethylsilane, 4,4-diaminodiphenylsilane, 1,4-diaminobenzene (p-phenylenediamine), 4,4'-bis(4-aminophenoxy) biphenyl, 4,4'-bis(3-aminophenoxy)biphenyl, 1,3-bis(3-aminophenoxy)benzene, 1,3-bis(4-aminophenoxy)benzene, 1,4-bis(4-aminophenoxy)benzene, 1,3-bis(3-aminophenoxy)benzene, 3,3'-diaminobenzophenone, 4,4'-diaminobenzophenone, 2,2'-dimethyl-4,4'-diaminobiphenyl, 2,2-bis{4-(4-aminophenoxy)phenyl}propane, 3,3'-dihydroxy-4,4'-diamino-1,1'-biphenyl, or 2,4-diaminotoluene. Such diamine components may be used alone or in combination of two or more.

The carboxylic acid dianhydride may be pyromellitic dianhydride, 3,3'4,4'-biphenyltetracarboxylic dianhydride, 2,2',3,3'-biphenyltetracarboxylic dianhydride, 2,3,3',4'-biphenyltetracarboxylic dianhydride, 3,3',4,4'-biphenylether tetracarboxylic dianhydride, 2,2-bis(3,4-dicarboxyphenyl) propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis (2,3-dicarboxyphenyl)methane dianhydride, bis(3,4-dicarboxyphenyl)methane dianhydride, 3,3',4,4'-benzophenonetetracarboxylic dianhydride, 2,3,2',3'-benzophenonetetracarboxylic dianhydride, 2,3,3',4'-benzophenonetetracarboxylic dianhydride, 1,3-bis(3,4-dicarboxyphenyl)-1,1,3,3-tetramethyldicyclohexane dianhydride, 2,2-bis(3,4-dicarboxyphenyl)hexafluoropropane dianhydride, 2,2-bis[4-(3,4-dicarboxyphenoxy)phenyl] hexafluoropropane dianhydride, or 2,2-bis[4-(3,4-dicarboxyphenoxy)phenyl]propane dianhydride. Such carboxylic dianhydride components may be used alone or in combination of two or more.

Further, the ratio of the total molar number of oxygen atoms derived from the ether bond which the diamine and the carboxylic dianhydride contain, to the total molar number of the diamine and the carboxylic dianhydride, is preferably from 35 to 70%, more preferably from 45 to 65%. In such a case, flexibility of the polymer main chain of the aromatic PI increases, stacking property of the aromatic ring improves, and the adhesion between the base film and the polymer layer further improves. Further, in such a case, UV processability of the film of the present invention will be more favorable.

To the base film in the present invention, for the purpose of improving the yield strength, hard plastic deformability, thermal conductivity, loop stiffness, etc., an inorganic filler may be added. Such an inorganic filler may be silicon oxide (silica), titanium oxide, aluminum oxide, silicon nitride, boron nitride, calcium hydrogen phosphate or calcium phosphate, and is preferably silica or boron nitride.

The PFA polymer in the present invention has TFE units and PAVE units. The PFA polymer may consist solely of TFE units and PAVE units or may further has other units.

The PFA polymer preferably further has a polar functional group. In such a case, adhesion of the polymer layer to the base film further improves. As a result, the film is more likely to have higher peel strength. Further, adhesion of the outermost surface of the film is likely to improve.

The polar functional group is preferably a hydroxy group-containing group, a carbonyl group-containing group, an acetal group or a phosphono group ($-OP(O)OH_2$), and with a view to further increasing adhesion to the substrate, more preferably a hydroxy group-containing group or a carbonyl group-containing group.

The hydroxy group-containing group is preferably a group containing an alcoholic hydroxy group, more preferably $-CF_2CH_2OH$, $-C(CF_3)_2OH$ or a 1,2-glycol group ($-CH(OH)CH_2OH$).

The carbonyl group-containing group is a group containing a carbonyl group ($>C(O)$) and is preferably a carboxy group, an alkoxycarbonyl group, an amide group, an isocyanate group, a carbamate group ($-OC(O)NH_2$), an acid anhydride residue ($-C(O)OC(O)-$), an imide residue (e.g. $-C(O)NHC(O)-$) or a carbonate group ($-OC(O)O-$).

The polar functional group may be contained in the units constituting the PFA polymer or may be contained in the terminal group of the polymer main chain. The polar functional group may be introduced to the PFA polymer e.g. by plasm treatment. As a PFA polymer having the polar functional group in the terminal group of the polymer main chain, a PFA polymer having a polar functional group as a terminal group derived from e.g. a polymerization initiator or a chain transfer agent may be mentioned.

The PFA polymer having a polar functional group preferably has TFE units, PAVE units and units having a polar functional group (units based on a monomer having a polar functional group), with a view to further increasing the adhesion to the base film).

The monomer having a polar functional group is preferably a monomer having an acid anhydride residue, more preferably itaconic anhydride, citraconic anhydride, 5-norbornene-2,3-dicarboxylic anhydride (another name: himic anhydride, hereinafter sometimes referred to as "NAH") or maleic anhydride.

PAVE is preferably $CF_2=CFOCF_3$ (PMVE), $CF_2=CFOCF_2CF_3$ or $CF_2=CFOCF_2CF_2CF_3$ (PPVE), and with a view to easily adjusting the melt viscosity or the melting temperature of the PFA polymer to be within the after-described ranges, PPVE is more preferred.

The PFA polymer is preferably a polymer having PAVE units in a proportion of the PAVE units of from 1 to 5 mol % to all the units.

The PFA polymer is preferably polymer (1) having TFE units and PAVE units, and having a polar functional group, or polymer (2) having TFE units and PAVE units, in a proportion of the PAVE units of from 2.0 to 5.0 mol % to all the units, and having no polar functional group.

By using such a PFA polymer, spherulites having a relatively small radius are likely to form. Accordingly, the polymer layer has high surface smoothness and has more improved adhesion to the base film.

The polymer (1) is preferably a polymer having TFE units, PAVE units and units based on a monomer having a polar functional group, and having polar functional groups, or a polymer having TFE units and PAVE units and having a polar functional group in the main chain terminal group, and the former polymer is more preferred. The polar functional group is preferably a hydroxy group-containing group or a carbonyl group-containing group.

The polymer (1) preferably has, to all the units, the TFE units in a proportion of from 90 to 99 mol %, the PAVE units in a proportion of from 0.5 to 9.97 mol % and the units based on a monomer having a polar functional group in a proportion of from 0.01 to 3 mol %.

Further, the monomer having a polar functional group is preferably itaconic anhydride, citraconic anhydride or 5-norbornene-2,3-dicarboxylic anhydride (NAH).

As specific examples of the polymer (1), polymers described in WO2018/16644 may be mentioned.

The polymer (2) preferably consist solely of TFE units and PAVE units, and has the TFE units in a proportion of from 95.0 to 98.0 mol % and the PAVE units in a proportion of from 2.0 to 5.0 mol % to all the units.

The content of the PAVE units in the polymer (2) is, to all the units, preferably 2.1 mol % or higher, more preferably 2.2 mol % or higher.

The polymer (2) having no polar functional group means that the number of the polar functional group which the polymer has is less than 500 per $1 \times 10^6$ carbon atoms constituting the polymer main chain. The number of the polar functional group is preferably 100 or less, more preferably less than 50. The lower limit of the number of the polar functional group is usually 0.

The polymer (2) may be produced by using a polymerization initiator or a chain transfer agent, which does not introduce the polar functional group as the terminal group of the polymer chain, or may be produced by fluorinating a PFA polymer having A polar functional group (e.g. a PFA polymer having a polar functional group derived from the polymerization initiator in the terminal group of the polymer main chain). As a fluorination method, a method using a fluorine gas may be mentioned (JP-A-2019-194314).

The PFA polymer is preferably thermally meltable, and its melt viscosity at 380° C. is preferably from $1 \times 10^2$ to $1 \times 10^6$ Pa·s, more preferably from $1 \times 10^3$ to $1 \times 10^6$ Pa·s.

The melting temperature of the PFA polymer is preferably 280° C. or higher, more preferably 290° C. or higher. The melting temperature is preferably 325° C. or lower, more preferably 320° C. or lower. By using such a PFA polymer, a polymer layer which is dense and is excellent in adhesion is likely to be obtained, and a film excellent in heat resistance is likely to be obtained.

The AR polymer in the present invention is a polymer having an aromatic group in its repeating unit structure and may, for example, be an aromatic polyamide, an aromatic polyimide, an aromatic polyamideimide, an aromatic maleimide, a styrene elastomer or a liquid crystal polyester. Among them, in the present invention, it is preferably an aromatic polyimide. When the AR polymer is an aromatic polyimide, the polymer layer is likely to have not only improved adhesion to the base film but also improved film physical properties (e.g. UV absorption).

The 5% weight loss temperature of the AR polymer is preferably 260° C. or higher, more preferably 300° C. or higher, further preferably 320° C. or higher. The 5% weight loss temperature of the AR polymer is preferably 600° C. or lower.

Within the above range, interface roughening of the polymer layer due to decomposed gas (bubbles) of the AR polymer and gas (bubbles) by by-products accompanying the reaction of the AR polymer itself, can effectively be suppressed, and the polymer layer is likely to have more improved adhesion to the base film.

The AR polymer may be thermoplastic or thermosetting.

When the AR polymer is thermoplastic, due to its plasticity, dispersibility of the AR polymer in the polymer layer will further improve, and a dense and uniform polymer layer is likely to be formed. As a result, the polymer layer is likely to have improved adhesion to the base film and film physical properties (e.g. UV absorption).

The thermoplastic AR polymer is preferably a thermoplastic polyimide. The thermoplastic polyimide means a polyimide which has been completely imidized and will no longer be imidized.

The glass transition point of the thermoplastic AR polymer is preferably 500° C. or lower, more preferably at most the melting temperature of the PFA polymer. The glass transition point of the thermoplastic AR polymer is preferably at least the glass transition point of the PFA polymer, more preferably 200° C. or higher. In such a case, the above effects are more likely to be exhibited.

When the AR polymer is thermosetting, in other words, when it is a cured product of a thermosetting aromatic polymer, the polymer layer will have further decrease linear expansion property, and warpage of the film is more likely to be suppressed.

The thermosetting AR polymer is preferably a polyimide having no plasticity, formed by imidization of a polyimide precursor (such as polyamic acid) or maleimide.

As specific examples of the AR polymer, aromatic polyamideimides such as "HPC" series (manufactured by Hitachi Chemical Company, Ltd.) and aromatic polyimides such as "Neopulim" series (manufactured by MITSUBISHI GAS CHEMICAL COMPANY, INC.), "SPIXAREA" series (manufactured by SOMAR Corp.), "Q-PILON" series (manufactured by PI R&D CO., LTD.), "WINGO" series (manufactured by WINGO TECHNOLOGY Co., Ltd.), "TOHMIDE" series (manufactured by T&K TOKA CO., LTD.) "KPI-MX" series (manufactured by Kawamura Sangyo Co., Ltd.) and "UPIA-AT" series (manufactured by Ube Industries, Ltd.) may be mentioned. As the aromatic polyimide as the AR polymer, the aromatic PI described for the base film may also be used.

As preferred embodiments of the PFA polymer and the AR polymer in the present invention, a glass transition point of the AR polymer of at most the melting temperature of the PFA polymer, a melting temperature of the PFA polymer of from 280 to 325° C., and a glass transition point of the AR polymer of from 180 to 360° C. may be mentioned. As a more specific embodiment of the glass transition point of the AR polymer, a glass transition point of from 200 to 320° C. and a glass transition point of from 260 to 360° C. may be mentioned.

In such embodiments, not only the PFA polymer and the AR polymer are likely to be uniformly dispersed in the polymer layer to improve the film physical properties but also in high temperature environment, the PFA polymer and the AR polymer are likely to highly interact with each other to further improve the heat resistance of the film.

In the film of the present invention, the base film and the polymer layer are preferably directly in contact with each other. That is, it is preferred that the polymer layer is directly formed on (covers) the surface of the base film without a surface treatment e.g. with a silane coupling agent or an adhesive. In such a case, physical properties of the film of the present invention are less likely to be deteriorated. According to the film of the present invention, by the above constitution, strong adhesion between the base film and each polymer layer develops even when the base film and each polymer layer are directly in contact with each other.

The thickness (total thickness) of the film of the present invention is preferably 25 μm or more, more preferably 50 μm or more. The thickness is preferably 1000 μm or less, more preferably 300 μm or less.

The thickness of the polymer layer is preferably 5 μm or more, more preferably 10 μm or more. The thickness of the polymer layer is preferably 200 μm or less, more preferably 100 μm or less.

The thickness of the base film is preferably 10 μm or more, more preferably 20 μm or more. The thickness of the base film is preferably 200 μm or less, more preferably 100 μm or less.

The ratio of the total thickness of the two polymer layers to the thickness of the base film is preferably 1 or higher. The ratio is preferably 3 or lower. In such a case, physical properties of the aromatic PI (e.g. high yield strength, hard plastic deformability) in the base film and physical properties of the PFA polymer (e.g. electrical properties such as low dielectric constant and low loss tangent, low water absorption) in the polymer layer are likely to develop in a well balanced manner. Further, even of a film having the above ratio being high and having thick polymer layers, warpage and separation are likely to be suppressed. Particularly when the elastic modulus in tension of the base film is the above lower limit or more, such tendency tends to be remarkable.

Further, the two polymer layers preferably have the same thickness. In such a case, the linear expansion coefficients of the two polymer layers are closer, and accordingly warpage of the film hardly occurs.

The thicknesses of the film of the present invention, the base film and the polymer layers are obtained by a contact thickness meter DG-525H (manufactured by ONO SOKKI CO., LTD) using a measurement tip AA-026 (ϕ10 mm, SR7).

The dielectric constant (relative dielectric constant) of the film of the present invention is preferably from 2.0 to 3.0. In such a case, the film of the present invention can suitably be used for e.g. a printed board material required to have a low dielectric constant.

The loss tangent of the film of the present invention is preferably from 0.0001 to 0.003. More specifically, the loss tangent of the film of the present invention is preferably less than 0.003, more preferably 0.0025 or less, further preferably 0.002 or less.

The content of the PFA polymer in each polymer layer is preferably 60 mass % or higher, more preferably 80 mass % or higher. Further, the content is less than 100 mass %, and is preferably 99 mass % or lower.

The content of the AR polymer in each polymer layer is preferably 0.01 mass % or higher, more preferably 0.1 mass % or higher. Further, the content is preferably 10 mass % or lower, more preferably 5 mass % or lower.

The amount of the AR polymer to the total amount of the PFA polymer and the AR polymer in each polymer layer is preferably 10 mass % or less, more preferably 7.5 mass % or less, further preferably 5 mass % or less. Further, the amount of the AR polymer is preferably 0.1 mass % or more.

When the contents of the PFA polymer and the AR polymer in the polymer layer respectively satisfy the above proportions and the content of the AR polymer to the PFA polymer is low, the polymer layer is likely to be in a form such that the AR polymer is highly dispersed in the PFA polymer. As a result, development of the physical properties (such as the above described electrical properties and low moisture absorption) of the PFA polymer and improvement in the adhesion to the base film by the AR polymer in the polymer layer, and the resulting suppression of warpage and separation of the film, are likely to be well balanced.

At the surface of each polymer layer (the surface opposite from the base film), polar functional groups are preferably present. When polar functional groups are present at the surface of the polymer layer, adhesion of the surface increases, whereby the adhesion strength to a substrate (e.g. a metal foil or an electric wire) to be bonded (attached) to the surface of the film can be improved. Further, an effect to reduce the linear expansion coefficient of the polymer layer can also be expected.

The polar functional groups present at the surface of the polymer layer are preferably hydroxy group-containing groups or carbonyl group-containing groups.

As a method to make the polymer layer have polar functional groups at its surface, a method of using a PFA polymer having a polar functional group, or a method of applying a surface treatment such as corona discharge treatment, plasm treatment, UV ozone treatment, excimer treatment, chemical etching or silane coupling treatment to the surface of the polymer layer, to introduce polar functional groups, may be employed.

Corona discharge treatment is carried out preferably in the presence of a flammable gas (e.g. vinyl acetate), whereby polar functional groups can efficiently be introduced.

As a plasma equipment in the plasma treatment, a high-frequency induction type, a capacitively coupled electrode type, a corona discharge electrode-plasma jet type, a parallel plate type, a remote plasma type, an atmospheric pressure plasma type and an ICP high density plasma type may, for example, be mentioned.

As a gas to be used for plasma treatment, a rare gas, a hydrogen gas or a nitrogen gas is preferred. As specific examples of such a gas, an argon gas, a mixed gas of a hydrogen gas and a nitrogen gas, and a mixed gas of a hydrogen gas, a nitrogen gas and an argon gas may be mentioned.

Further, the film of the present invention may be subjected to annealing treatment to adjust the residual stress. As the annealing treatment conditions, a temperature of from 120 to 180° C., a pressure of from 0.005 to 0.015 MPa and a time of from 30 to 120 minutes are preferred.

The film of the present invention may be produced suitably by a method (the present method) of applying a powder dispersion containing a powder of the PFA polymer (hereinafter sometimes referred to as "F powder"), the AR polymer or its precursor, and a liquid medium, to the surface of the aromatic PI base film, followed by heating to form a polymer layer, thereby to obtain a film having the polymer layer formed on each side of the base film.

D50 of the F powder in the present method is preferably 50 μm or smaller, more preferably 20 μm or smaller, further preferably 3 μm or smaller. D50 of the F powder is preferably 0.05 μm or larger, more preferably 0.3 μm or larger, further preferably 1 μm or larger. Further, D90 of the F powder is preferably less than 100 μm, more preferably 6 μm or smaller.

The specific surface area of the F powder is preferably from 1 to 8 $m^2/g$, more preferably from 1 to 5 $m^2/g$, further preferably from 1 to 3 $m^2/g$.

In such a case, the F powder has favorable fluidity and dispersibility, and electrical properties and heat resistance the polymer layer are more likely to be achieved.

The F powder preferably contains the PFA polymer as the main component, more preferably consists essentially of the PFA polymer. The content of the PFA polymer in the powder is preferably 80 mass % or higher, more preferably 100 mass %. The F powder may contain a polymer other than the F polymer. Such other polymer may be an aromatic polyester, a polyamideimide, a thermoplastic polyimide, a polyphenylene ether or a polyphenylene oxide.

The F powder may contain an inorganic substance. The inorganic substance may be an oxide, a nitride, a metal single substance, an alloy or a carbon, more specifically, silicon oxide (silica), a metal oxide (such as beryllium oxide, cerium oxide, alumina, soda alumina, magnesium oxide, zinc oxide or titanium oxide), boron nitride or magnesium metasilicate (steatite). The F powder containing an inorganic substance is preferably in a form of particles comprising the PFA polymer as cores and having the inorganic substance on the surface of the cores.

The AR polymer or its precursor in the present method is preferably a polymer soluble in the liquid medium of the powder dispersion, whereby interaction between the AR polymer and other components (the PFA polymer and the liquid medium) in the powder dispersion increases, and dispersibility in the powder dispersion tends to more improve. As a result, in heating at the time of forming the polymer layer, fluidity of the AR polymer improves, and a polymer layer which has physical properties of the PFA polymer such as electrical properties highly developed, while having the AR polymer highly dispersed, and which has higher adhesion to the base film, is likely to be formed.

The solubility (g/100 g solvent) of the AR polymer or its precursor in the liquid medium of the powder dispersion at 25° C. is preferably from 5 to 30.

The precursor of the AR polymer is a compound which forms the AR polymer by heating at the time of forming the polymer layer. For example, when the AR polymer is a polyimide, a precursor thereof may be a polyamic acid.

The liquid medium in the present method is preferably a solvent which is liquid at 25° C., which functions as a dispersion medium for the F powder which is unreactive with the F powder, and in which the AR polymer is soluble. The liquid medium may be used alone or in combination of two or more.

The boiling point of the liquid medium is preferably from 125 to 250° C. Within such a range, the F powder highly flows and is densely packed when the liquid medium is evaporated from the powder dispersion and as a result, a dense polymer layer is likely to be formed.

The liquid medium is preferably an aprotic polar solvent.

As specific examples of the liquid medium, 1-propanol, 2-propanol, 1-buanol, 1-methoxy-2-propanol, N,N-dimethylformamide, N,N-dimethylacetamide, methyl ethyl ketone, N-methyl-2-pyrrolidone, γ-butyrolactone, cyclohexanone, cyclopentanone, dimethyl sulfoxide, diethyl ether, dioxane, butyl acetate, methyl isopropyl ketone, ethylene glycol monoisopropyl ether, and cellosolve (e.g. methyl cellosolve or ethyl cellosolve) may be mentioned.

The liquid medium is, from the viewpoint of adjustment of the liquid property (e.g. viscosity and thixotropic ratio) o the powder dispersion and high interaction with the respective components, preferably an ester, a ketone or an amide, more preferably γ-butyrolactone, methyl ethyl ketone, cyclohexanone, N,N-dimethylformamide or N-methyl-2-pyrrolidone.

With a view to promoting dispersion of the F powder and the interaction with the AR polymer and to improving physical properties of the polymer layer to be formed, the powder dispersion in the present method preferably further contains a polymer dispersing agent. The polymer dispersing agent is a component (compound) different from both the PFA polymer and the AR polymer, and is preferably a nonionic surfactant having a hydrophilic moiety and a hydrophobic moiety.

The hydrophilic moiety is preferably a molecular chain containing a nonionic functional group (such as an alcoholic hydroxy group or an oxyalkylene group).

The hydrophobic moiety is preferably a molecular chain containing an alkyl group, an acetylene group, a siloxane group or a fluorinated group, more preferably a molecular chain containing a fluorinated group.

When the powder dispersion contains such a nonionic surfactant, the dispersion stability of the dispersion will improve, and the uniformity of the layer to be formed by heating is more likely to improve.

The nonionic surfactant is preferably a thermally decomposable nonionic surfactant, more preferably a nonionic surfactant which will be thermally decomposed within a temperature range for forming the layer by heating. As specific examples of such a surfactant, nonionic surfactants with a mass reduction ratio in a temperature region of from 80 to 300° C. of 1 mass %/min or higher may be mentioned, more specifically nonionic surfactants with a mass reduction ratio in a temperature region of from 100 to 200° C. of 1 mass %/min or higher, and nonionic surfactants with a mass reduction ratio in a temperature region of from 200 to 300° C. of 1 mass %/min or higher may be mentioned.

The mass reduction ratio of the surfactant may be measured by using a thermogravimetry analyzer (TG) and a thermogravimetry differential thermal analyzer (TG-DTA) at a temperature-increasing rate of 10° C./min with a surfactant sample amount of 10 mg in an atmosphere of mixed gas (helium 90 vol % and oxygen 10 vol %).

For example, the "mass reduction rate of the surfactant in a temperature region of from 200 to 300° C." is obtained as a percentage obtained by dividing the mass reduction when 10 mg of a surfactant is heated from 200° C. to 300° C. at a rate of 10° C./min using a thermogravimetry differential thermal analyzer (TG-DTA) in an atmosphere of mixed gas (helium 90 vol % and oxygen 10 vol %), by the temperature-increasing time (10 min) and the surfactant sample amount (10 mg).

The upper limit of the mass reduction rate is preferably 50 mass %/min.

The mass reduction rate is preferably from 2 to 50 mass %/min, more preferably from 4 to 20 mass %/min, particularly preferably from 6 to 15 mass %/min.

When the powder dispersion contains such a surfactant, the surfactant decomposes when the layer is formed by heating, hydrophilic components derived from decomposed products of the surfactant are segregated at the surface of the polymer layer to be formed, and the peel strength of the film of the present invention and adhesion between the film of the present invention and other substrate (e.g. a copper foil) are likely to be adjusted. Further, the amount of the residue of the surfactant in the polymer layer is reduced, and its physical properties (e.g. electrical properties) are likely to improve.

As specific examples of such a surfactant, a polyorganosiloxane, a polyol, a polyoxyalkylene glycol and a polycaprolactam may be mentioned. As a polyol, a polymer-form polymer having units based on a monomer having a carbon-carbon unsaturated double bond and at least two hydroxy groups is preferred, and polyvinyl alcohol, polyvinyl butyral and a fluoropolyol are more preferred.

As the nonionic surfactant, a fluorinated surfactant, a silicone surfactant, and an acetylene surfactant may be mentioned.

As a preferred embodiment of the fluorinated surfactant, a polymer surfactant having a perfluoroalkyl group or a perfluoroalkenyl group, and an oxyalkylene group or an alcoholic hydroxy group, respectively in its side chains, may be mentioned.

The polymer surfactant is preferably nonionic.

The weight average molecular weight of the polymer surfactant is preferably from 2000 to 80000.

The fluorine content of the polymer surfactant is preferably from 20 to 50 mass %.

When the polymer surfactant has an oxyalkylene group, the oxyalkylene group content is preferably from 20 to 50 mass %.

When the polymer surfactant has an alcoholic hydroxy group, the hydroxy value of the polymer surfactant is preferably from 10 to 300 mgKOH/g.

The perfluoroalkyl group or the perfluoroalkenyl group preferably has from 4 to 16 carbon atoms. Further, the perfluoroalkyl group or the perfluoroalkenyl group may have an etheric oxygen atom between carbon atoms.

The oxyalkylene group may be a single type of oxyalkylene group, or may be two or more types of oxyalkylene groups. In the latter case, the different types of oxyalkylene groups may be arranged at random or in a block.

The oxyalkylene group is preferably an oxyethylene group or an oxypropylene group, more preferably an oxyethylene group.

As suitable specific examples of the polymer dispersing agent, a copolymer of a (meth)acrylate having a perfluoroalkyl group or a perfluoroalkenyl group, and a (meth)acrylate having an oxyalkylene group or an alcoholic hydroxy group, may be mentioned.

As specific examples of the former (meth)acrylate, $CH_2=C(CH_3)C(O)OCH_2CH_2(CF_2)_4F$, $CH_2=C(CH_3)C(O)OCH_2CH_2(CF_2)_6F$, $CH_2=CHC(O)OCH_2CH_2OCF(CF_3)C(=C(CF_3)_2)(CF(CF_3)_2)$, $CH_2=C(CH_3)C(O)OCH_2CH_2OCF(CF_3)C(=C(CF_3)_2)(CF(CF_3)_2)$, $CH_2=CHC(O)OCH_2CH_2CH_2CH_2OCF(CF_3)C(=C(CF_3)_2)(CF(CF_3)_2)$, and $CH_2=C(CH_3)C(O)OCH_2CH_2CH_2CH_2OCF(CF_3)C(=C(CF_3)_2)(CF(CF_3)_2)$ may be mentioned.

As specific examples of the latter (meth)acylate, $CH_2=C(CH_3)C(O)OCH_2CH_2OH$, $CH_2=C(CH_3)C(O)OCH_2CH_2CH_2CH_2OH$, $CH_2=C(CH_3)C(O)(OCH_2CH_2)_4OH$, $CH_2=C(CH_3)C(O)(OCH_2CH_2)_9OH$, $CH_2=C(CH_3)C(O)(OCH_2CH_2)_{23}OH$, $CH_2=C(CH_3)C(O)(OCH_2CH_2)_9OCH_3$, $CH_2=C(CH_3)C(O)(OCH_2CH_2)_{23}OCH_3$, $CH_2=C(CH_3)C(O)(OCH_2CH_2)_{66}OCH_3$, and $CH_2=C(CH_3)C(O)(OCH_2CH_2)_{12}OCH_3$ may be mentioned.

As specific examples of the polymer dispersing agent, "FTERGENT" series (manufactured by NEOS COMPANY LIMITED), "SURFLON" series (AGC SEIMI CHEMICAL CO., LTD.), "MEGAFACE" series (manufactured by DIC Corporation), "UNIDYNE" series (manufactured by DAIKIN INDUSTRIES, LTD.) may be mentioned.

The proportion (content) of the PFA polymer in the powder dispersion is preferably from 20 to 50 mass %.

The proportion (content) of the AR polymer or its precursor in the powder dispersion is preferably from 0.1 to 25 mass %.

The proportion (content) of the liquid medium in the powder dispersion is preferably from 40 to 80 mass %.

In the powder dispersion, the amount of the AR polymer to the total amount of the PFA polymer and the AR polymer is preferably 10 mass % or less, more preferably 7.5 mass % or less, further preferably 5 mass % or less. Further, the amount of the AR polymer is preferably 0.1 mass % or more. Within such a range, dispersibility of the powder dispersion further improves, and physical properties (e.g. electrical properties, adhesion, surface smoothness, and UV absorption) of the polymer layer to be formed and the adhesion of the polymer layer to be formed to the base film are more likely to improve. The above proportion is maintained in the polymer layer to be formed.

The powder dispersion may contain other material within a range not to impair the effects of the present invention. Such other material may, for example, be a thixotropy-imparting agent, a deforming agent, an inorganic filler, a reactive alkoxysilane, a dehydrating agent, a plasticizer, a weathering agent, an antioxidant, a heat stabilizer, a lubricant, an antistatic agent, a brightening agent, a coloring agent, a conducting agent, a release agent, a surface treatment agent, a viscosity adjusting agent, and a flame retardant.

Such other material may or may not be dissolved in the powder dispersion.

The viscosity of the powder dispersion is preferably from 50 to 100000 mPa·s, further preferably from 75 to 1000 mPa·s. In such a case, the powder dispersion is excellent in coating property, and accordingly a polymer layer having an optional thickness is likely to be formed.

The thixotropic ratio ($\eta_1/\eta_2$) of the powder dispersion is preferably from 1.0 to 2.2. In such a case, the powder dispersion is not only excellent in coating property but also excellent in homogeneity, and accordingly a denser polymer layer is likely to be formed. The thixotropic ratio ($\eta_1/\eta_2$) is calculated by dividing the viscosity $\eta_1$ of the powder dispersion measured at a number of revolutions of 30 rpm by the viscosity $\eta_2$ of the powder dispersion measured at a number of revolutions of 60 rpm.

The method of coating the base film with the powder dispersion may be any method capable of forming a stable liquid coating film comprising the powder dispersion on the surface of the base film, and may, for example, be a spray coating method, a roll coating method, a spin coating method, a gravure coating method, a microgravure coating method, a gravure offset method, a knife coating method, a kiss coating method, a bar coating method, a die coating method, a fountain mayer bar coating method, or a slot die coating method.

At the time of heating the base film on which the liquid coating film is formed, it is preferred to hold the base film to a temperature in a low temperature region to distill the liquid medium off (that is to dry), whereby a dry coating film is obtained. The temperature in the low temperature region is preferably 80° C. or higher and less than 180° C. The temperature in the low temperature region means the temperature of the atmosphere at the time of drying.

Holding at a temperature in the low temperature region may be conducted in a single step or in two or more steps at different temperatures.

The atmosphere when the base film is held at a temperature in the low temperature region may be either under normal pressure or under reduced pressure. Further, the atmosphere may be any of an oxidizing gas (e.g. oxygen gas) atmosphere, a reducing gas (e.g. hydrogen gas) atmosphere and an inert gas (e.g. rare gas or nitrogen gas) atmosphere.

In this method, further, it is preferred to heat the dry coating film at a temperature region exceeding the holding temperature in the low temperature region (hereinafter sometimes referred to as "firing region") to heat the F powder (PFA polymer), that is to fire the F powder (PFA polymer) to form the polymer layer on the surface of the base film. The temperature of the firing region means the temperature of the atmosphere at the time of firing.

Forming of the polymer layer is considered to proceed by dense packing of the particles of the F powder to cause fusion of the F powder (PFA polymer). When the AR polymer is thermally meltable, a polymer layer comprising a mixture of the PFA polymer and the AR polymer is formed, and when the AR polymer is heat-curing, a polymer layer comprising a cured product of the PFA polymer and the AR polymer is formed. When the powder dispersion contains the above-described thermally decomposable surfactant, thermal decomposition of the surfactant proceeds, and accordingly the polymer layer is likely to be excellent in electrical properties.

The atmosphere at the time of firing may be either under normal pressure or under reduced pressure. Further, the atmosphere may be any of an oxidizing gas (e.g. oxygen gas) atmosphere, a reducing gas (e.g. hydrogen gas) atmosphere and an inert gas (rare gas or nitrogen gas) atmosphere.

The atmosphere at the time of firing is preferably an atmosphere containing an oxygen gas. The oxygen gas concentration (volume basis) in this atmosphere is preferably from $1\times10^2$ to $3\times10$ ppm, particularly preferably from $0.5\times10^3$ to $1\times10^4$ ppm. In such a case, flowing of the respective components is promoted, and particularly when the powder dispersion contains the above thermally decomposable surfactant, its decomposition and flowing are promoted, and adhesion of the polymer layer and physical properties (e.g. electrical properties) of the polymer layer are more likely to improve.

The temperature in the firing region is preferably at least the melting temperature of the PFA polymer, more preferably from 300 to 380° C.

The time for holding the base film at a temperature in the firing region is preferably from 30 seconds to 5 minutes, particularly preferably from 1 to 2 minutes.

On that occasion, the elastic modulus in tension at 320° C. of the base film is preferably 0.2 GPa or higher, more preferably 0.4 GPa or higher. Further, the elastic modulus in tension is preferably 10 GPa or lower, more preferably 5 GPa or lower. When the elastic modulus in tension of the base film is the above lower limit or more, shrinkage of the polymer layer which will occur at the time of firing the F powder and cooling after hot press is likely to be more effectively relaxed by elasticity of the base film. As a result, the film of the present invention is less likely to be wrinkled, and a film more excellent in physical properties such as surface smoothness is likely to be obtained. Such a tendency is remarkable when the imide group density or the glass transition point of the aromatic PI in the base film is low. Further, when the elastic modulus in tension of the base film is the above upper limit or less, the film of the present invention will be more excellent in flexibility.

The film of the present invention may be produced not only by the above production method but also by sandwiching a separately prepared base film between two polymer films to be the polymer layers and hot pressing them.

The film of the present invention, which has polymer layers excellent in adhesion of the surface, can easily and strongly be bonded to other substrate. Such other substrate may be a metal foil or a metal conductor.

The metal-clad laminate of the present invention comprises the film of the present invention and a metal foil bonded to each side of the film of the present invention. By processing the metal foil, the metal-clad laminate can easily be processed into a printed board. As the metal constituting the metal foil, copper, a copper alloy, stainless steel, nickel, a nickel alloy (including 42 alloy), aluminum, an aluminum alloy, titanium and a titanium alloy may be mentioned.

The metal foil is preferably a copper foil, more preferably a calendered copper foil without distinction between front and rear sides, or an electrolytic copper foil with a distinction between front and rear sides, further preferably a calendered copper foil. With the calendered copper foil, which has a small surface roughness, the transmission loss can be reduced even when the metal-clad laminate is processed into a printed wiring board. Further, the calendered copper foil is used preferably after removing the rolling oil by immersion in a hydrocarbon organic solvent.

The ten point height of roughness profile of the surface of the metal foil is preferably from 0.01 to 4 μm. In such a case, the metal foil has favorable adhesion to the polymer layer, and a printed board excellent in transmission properties is likely to be obtained.

The surface of the metal foil may be subjected to a roughening treatment. The roughening treatment method may be a method of forming a roughened layer, a dry etching method or a wet etching method.

The thickness of the metal foil is not limited so long as a sufficient function is exhibited in application of the metal-clad laminate. The thickness of the metal foil is preferably less than 20 μm, more preferably from 2 to 15 μm.

Further, the surface of the metal foil may be treated with a silane coupling agent partly or entirely.

As a method of laminating the metal foil on the surface of the polymer layer in production of the metal-clad laminate of the present invention, a method of hot pressing the film of the present invention and the metal foils may be mentioned.

The pressing temperature at the time of hot pressing is preferably from 310 to 400° C.

The hot pressing is carried out preferably at a degree of vacuum of 20 kPa or lower, so as to suppress inclusion of bubbles and to suppress deterioration by oxidation.

Further, at the time of hot pressing, it is preferred to increase the temperature after the above degree of vacuum is achieved. If the temperature is increased before the degree of vacuum is achieved, the layers are contact bonded in a state where the polymer layer is softened, that is the polymer layer has fluidity and adhesion to a certain extent, thus leading to bubbles.

The pressure for the hot pressing is preferably from 0.2 to 10 MPa, so that the polymer layer and the metal foil are strongly bonded while breakage of the metal foil is suppressed.

Particularly when the elastic modulus in tension of the base film is the above lower limit or more, wrinkles by heating and coiling in hot pressing are likely to be suppressed.

The metal-clad laminate of the present invention is useful for production of a printed board, as a flexible copper-clad laminated board or a rigid copper-clad laminated board.

The printed board may be produced, for example, by processing the metal foil of the metal-clad laminate of the present invention into a conductor circuit (pattern circuit) having a predetermined pattern e.g. by etching, or processing the metal-clad laminate of the present invention into a pattern circuit e.g. by electrolytic plating (e.g. semi additive process (SAP) or modified semi additive process (MSAP)).

In production of the printed board, after the pattern circuit is formed, an interlayer insulating film may be formed on the pattern circuit, and a conductor circuit is further formed on the interlayer insulating film. The interlayer insulating film may be formed from the above powder dispersion.

In production of the printed board, a solder resist may be laminated on the pattern circuit. The solder resist may be formed by the above powder dispersion.

In production of the printed board, a cover lay film may be laminated on the pattern circuit.

The coated metal conductor of the present invention comprises a metal conductor and the film of the present invention formed to coat the metal conductor. The coated metal conductor may be suitably used, for example, for aerospace electric wires and electric wire coils.

The material constituting the metal conductor is preferably copper, a copper alloy, aluminum or an aluminum alloy. Such a metal has excellent electrical conductivity.

Further, the cross-sectional shape of the metal conductor may be cylindrical or rectangular.

The coated metal conductor of the present invention may be produced by a method of disposing a metal conductor on one surface of the film of the present invention and coating the metal conductor with the film.

As a method for producing such a coated metal conductor, a method of cutting the film of the present invention into a thin strip to prepare a tape, and winding the tape around the metal conductor spirally. Otherwise, after the tape is wound around the metal conductor, the tape may further be overlaid. Further, the tape may be wound around the metal conductor e.g. by a wrapping machine.

The film of the present invention, the method for producing the film, the metal-clad laminate, and the coated metal conductor have been described above, however, the present invention is by no means restricted to the above described embodiments.

For example, each of the film, the metal-clad laminate and the coated metal conductor of the present invention has the above described embodiment and may further have other optional constitution, or may be substituted with other constitution having the similar function.

Further, the method for producing the film of the present invention has the above-described embodiment and may further have other step, or may be substituted with other optional step having the similar function.

EXAMPLES

Now, the present invention will be described in further detail with reference to Examples. However, it should be understood that the present invention is by no means restricted thereto.

1. Preparation of Components

[TFE Polymer]

F polymer 1: PFA polymer having TFE units, NAH units and PPVE units respectively in amounts of 98.0 mol %, 0.1 mol % and 1.9 mol % (melting temperature: 300° C.)

F polymer 2: PFA polymer having TFE units and PPVE units respectively in amounts of 97.5 mol % and 2.5 mol % (melting temperature: 305° C.)

F polymer 3: non-PFA polymer comprising TFE units and HFP units (FEP, melting temperature: 250° C.)

[Powder]

Powder 1: powder comprising F polymer 1 having D50 of 1.9 μm.

Powder 2: powder comprising F polymer 2 having D50 of 0.3 μm.

Powder 3: powder comprising F polymer 3 having D50 of 0.3 μm.

[Varnish of AR Polymer 1]

Varnish of AR polymer 1: NMP solution containing the AR polymer 1 as the aromatic polyimide (solid content: 10 wt %, inherent viscosity:1.2 dL/g)

The AR polymer 1 is a block copolymer of 3,3'4,4'-benzophenonetetracarboxylic dianhydride, 2,4-diaminotoluene, 3,3'4,4'-biphenyltetracarboxylic dianhydride, and 2,2-bis{4-(4-aminophenoxy)phenyl}propane (molar ratio=1:1:1:1) and its glass transition point is 322° C.

[Surfactant]

Surfactant 1: a copolymer of $CH_2$=CHCOO$(CH_2)_4$OCF$(CF_3)(C(CF(CF_3)_2)(=C(CF_3)_2)$ and $CH_2$=CHCOO$(CH_2CH_2O)_8$OH (molar ratio=1:1, weight average molecular weight: about 10000, mass reduction rate at from 200 to 300° C.: 6 mass %/min, nonionic)

[Base Film]

Polyimide film 1: aromatic polyimide film having a thickness of 50 μm, a glass transition point of 310° C., an imide group density of 0.25, and an elastic modulus in tension at 320° C. of 0.3 GPa (manufactured by SKC Kolon PI, "FS-200")

Polyimide film 2: aromatic polyimide film having a thickness of 50 μm, a glass transition point of 298° C., an imide group density of 0.26, and an elastic modulus in tension at 320° C. of 0.1 GPa Polyimide film 3: aromatic polyimide film having a thickness of 50 μm, a glass transition point of 420° C., an imide group density of 0.38, and an elastic modulus in tension at 320° C. of 7 GPa 2. Preparation of Powder Dispersion (Powder Dispersion 1)

First, 47 parts by mass of NMP, 3 parts by mass of the surfactant 1 and 49.5 parts by mass of powder 1 were charged into a pot, and zirconia balls were charged into the pot. The pot was rotated at 150 rpm for 1 hour to disperse the powder 1 to obtain a mixed liquid.

Then, to the mixed liquid, the varnish of AR polymer 1 was added so that the amount (solid content) of the AR polymer 1 in the powder dispersion would be 0.5 mass % while the stirrer was rotated at a number of revolutions of 500 rpm, to prepare powder dispersion 1. That is, the amount of the AR polymer 1 to the total amount of the F polymer 1 and the AR polymer 1 is 1 mass %.

(Powder Dispersion 2)

Powder dispersion 2 was prepared in the same manner as preparation of the powder dispersion 1 except that the F powder 2 was used instead of the powder 1.

(Powder Dispersion 3)

The mixed liquid (mixed liquid containing only NMP, the surfactant 1 and the powder 2) obtained in the process for preparing the powder dispersion 2 was used as powder dispersion 3 as it was.

(Powder Dispersion 4)

Powder dispersion 4 was prepared in the same manner as preparation of the powder dispersion 1 except that the powder 3 was used instead of the powder 1.

3. Production of Film (Ex. 1)

On one surface of the polyimide film 1, the powder dispersion 1 was applied by small diameter reverse gravure method and the polyimide film 1 was made to pass through a hot air drying oven (oven temperature: 150° C.) over a period of 3 minutes to remove NMP to form a dry coating film.

Further, on the other side of the polyimide film 1, similarly, the powder dispersion 1 was applied and dried to form a dry coating film.

Then, the polyimide film 1 having the dry coating film formed on each side was made to pass through a far infrared oven (oven temperature: 380° C.) over a period of 20 minutes to melt and fire the powder 1, whereby a polymer layer (thickness: 25 μm) containing the F polymer 1 and the AR polymer 1 was formed on each side of the polyimide film 1 to obtain a film (film 1) having the polymer layer, the polyimide film and the polymer layer directly formed in this order.

(Ex. 2)

In the same manner as in Ex. 1 except that the powder dispersion 2 was used instead of the powder dispersion 1, a polymer layer (thickness: 25 μm) containing the F polymer 2 and the AR polymer 1 was formed on each side of the polyimide film 1 to obtain a film (film 2) having the polymer layer, the polyimide film and the polymer layer directly formed in this order.
(Ex. 3)
In the same manner as in Ex. 1 except that the powder dispersion 3 was used instead of the powder dispersion 1, a polymer layer (thickness: 25 μm) containing the F polymer 2 and containing no AR polymer 1 was formed on each side of the polyimide film 1 to obtain a film (film 3) having the polymer layer, the polyimide film and the polymer layer directly formed in this order.
(Ex. 4)
In the same manner as in Ex. 1 except that the powder dispersion 4 was used instead of the powder dispersion 1, a polymer layer (thickness: 25 μm) containing the F polymer 3 and the AR polymer 1 was formed on each side of the polyimide film 1 to obtain a film (film 4) having the polymer layer, the polyimide film and the polymer layer directly formed in this order.
(Ex. 5)
In the same manner as in Ex. 1 except that the polyimide film 2 was used instead of the polyimide film 1, a polymer layer (thickness: 25 μm) containing the F polymer 1 and the AR polymer 1 was formed on each side of the polyimide film 2 to obtain a film (film 5) having the polymer layer, the polyimide film and the polymer layer directly formed in this order.
(Ex. 6)
In the same manner as in Ex. 1 except that the polyimide film 3 was used instead of the polyimide film 1, a polymer layer (thickness: 25 μm) containing the F polymer 1 and the AR polymer 1 was formed on each side of the polyimide film 3 to obtain a film (film 6) having the polymer layer, the polyimide film and the polymer layer directly formed in this order.

The outer appearances of the films were visually confirmed and as a result, no wrinkles were confirmed on the films 1 to 4 and 6, and wrinkles were confirmed on the film 5.

3. Measurement
3-1. Measurement of Linear Expansion Coefficient
Using a thermomechanical analyzer (manufactured by SII NanoTechnology Inc., "TMA/SS6100"), the linear expansion coefficient when a film (width: 3 mm, length 10 mm) was heated at a rate of 10° C./min from 0° C. to 400° C. and cooled at 40° C./min to 10° C., and further heated at 10° C./min from 10° C. to 200° C. was obtained. The measurement load was 29.4 mN, and the measurement atmosphere was air atmosphere.

3-2. Measurement of Peel Strength
From the film, a rectangular test specimen having a length of 100 mm and a width of 10 mm was cut. Then, the base film and one of the polymer layers were separated to the position of 50 mm from one end in the length direction of the test specimen. Then, setting the position of 50 mm from one end in the length direction of the test specimen at the center, using a tensile tester (manufactured by ORIENTEC CORPORATION), the other polymer layer was peeled at 90 degrees at a rate of pulling of 50 mm/min, and the maximum load was taken as the peel strength (N/cm).

3-3. Measurement of Water Absorption Coefficient
The film was preliminarily dried at 50° C. for 48 hours and dipped in pure water at 23° C. for 24 hours in accordance with ASTM D570. The mass of the F layer before and after the dipping in the pure water was measured and the water absorption coefficient was obtained based on the following formula.

Water absorption coefficient (%) =

(mass after dipping in water − mass after preliminary drying)/mass after preliminary drying × 100

The measurement results in Ex. 1 to 4 are shown in the following Table 1.

TABLE 1

|  | Ex. 1 | Ex. 2 | Ex. 3 | Ex. 4 |
|---|---|---|---|---|
| Film | Film 1 | Film 2 | Film 3 | Film 4 |
| Linear expansion coefficient [ppm/° C.] | At most 30 | At most 30 | Higher than 30 | At most 30 |
| Peel strength [N/cm] | At least 10 | At least 10 | Less than 10 | At least 10 |
| Water absorption coefficient [%] | At most 0.1 | At most 0.1 | At most 0.1 | At most 0.1 |

The optical absorption coefficient at a wavelength of 355 nm was 90% for the films 1 and 2, 10% for the film 3 and 50% for the film 4.

4. Double-Sided Copper Clad Laminate
On each side of the above obtained film, a copper foil (electrolytic copper foil CF-T49A-DS-HD2-12, manufactured by Fukuda Metal Foil & Powder Co., Ltd.) was disposed and pressed in vacuum at 340° C. for 20 minutes, to prepare double-sided copper clad laminates 1, 2, 3 and 4 respectively from the films 1, 2, 3 and 4. The outer appearance of the double-sided copper clad laminates 1 to 4 was visually observed and as a result, no wrinkles were confirmed.

5-1. Evaluation of UV Laser Processability
Using a laser processing machine, UV-YAG laser light having a wavelength of 355 nm was applied to the double-sided copper clad laminate so as to draw a circle having a diameter of 100 μm, thereby to form a circular through hole on the double-sided copper clad laminate. The laser output was 1.2 W, the laser focal diameter was 25 μm, the number of laps on the circle was 20, and the oscillation frequency was 40 kHz.

Then, a fragment of the double-sided copper clad laminate including the through hole was cut out and embedded in a thermosetting epoxy resin. The fragment was abraded until the cross section of the through hole was exposed, and the cross section at a portion where the through hole was formed was observed by a microscope.

A microscopic photograph of the cross section around the through hole 5 in the double-sided copper clad laminate obtained 1 is shown in FIG. 1.

The double-sided copper clad laminate 1 has favorable UV processability since the polymer layer contains the aromatic polyimide. Accordingly, as shown in the microscopic photograph in FIG. 1, the degree of deterioration of the polymer layer and the polyimide film by UV was suppressed around the through hole 5.

Whereas the double-sided copper clad laminate 3 required a long UV irradiation time to form the through hole 5 since the polymer layer contained no aromatic polyimide (AR polymer 1), and the degree of deterioration of the polymer layer and the polyimide film by UV was significant around the through hole 5.

Further, the double-sided copper clad laminate 4 also required a long UV irradiation time to form the through hole 5 and the degree of deterioration of the polymer layer and the polyimide film by UV was significant around the through hole 5.

5-2. Evaluation of Solder Reflow Resistance

Each of the double-sided copper clad laminates 1 to 4 was floated in a solder bath at 288° C. for 60 seconds ten times, whereupon swelling at the interface between the polymer layer and the copper foil and peeling at the interface were confirmed and evaluated in accordance with the following evaluation standards.

○ (good): Neither swelling nor peeling observed on the interface.

Δ (fair): No swelling observed on the interface, but peeling observed partly at the edge.

x (poor): Both swelling and peeling observed on the interface.

The evaluation results are shown in the following Table 2.

TABLE 2

|  | Ex. 1 | Ex. 2 | Ex. 3 | Ex. 4 |
|---|---|---|---|---|
| Film | Film 1 | Film 2 | Film 3 | Film 4 |
| Solder reflow resistance | ○ | Δ | x | * |

*: Evaluation impossible since the polymer layer was molten during evaluation test.

Further, in the same manner as in the preparation of the double-sided copper clad laminate 1, double-sided copper clad laminates 5 and 6 were prepared respectively from the films 5 and 6. The outer appearance was visually observed and as a result, wrinkles resulting from the polymer layer were confirmed on the double-sided copper clad laminate 5, and no wrinkles were confirmed on the double-sided copper clad laminate 6.

Each double-sided copper clad laminate was cut into a 5 mm square and folded 180° at a curvature radius of 300 μm, a load (50 mN, 1 minute) was applied and then the laminate was unfolded, and the outer appearance was confirmed. As a result, no abnormal appearance was observed at the crease on the double-sided copper clad laminates 1 to 5, and blushing was observed at the crease on the double-sided copper clad laminate 6.

(Ex. 7)

In the same manner as in Ex. 1 except that the oven temperature of the far infrared oven was 330° C., the atmospheric gas in the far infrared oven was a nitrogen gas at an oxygen gas concentration of 8000 ppm, and the passing time was 3 minutes, a polymer layer (thickness: 25 μm) containing the F polymer 1 and the AR polymer 1 was formed on each side of the polyimide film 1, to obtain a film (film 7) having the polymer layer, the polyimide film and the polymer layer directly formed in this order.

(Ex. 8)

In the same manner as in Ex. 7 except that the atmospheric gas in the far infrared oven was a nitrogen gas at an oxygen gas concentration of less than 100 ppm, a polymer layer (thickness: 25 μm) containing the F polymer 1 and the AR polymer 1 was formed on each side of the polyimide film 1 to obtain a film (film 8) having the polymer layer, the polyimide film and the polymer layer directly formed in this order.

With respect to the films 7 and 8, by means of SPDR (split post dielectric resonators) method, the loss tangent (measurement frequency: 10 GHz) of the polymer layer was measured. As a result, the loss tangent of the film 7 was 0.002, and the loss tangent of the film 8 was 0.003, and electrical properties of the film 7 further improved. Further, hydrophilicity of the surface of the film 7 and hydrophilicity of the surface of the film 8 were different. Such effects were not achieved when the surfactant in the powder dispersion 1 was changed to a non-thermally decomposable surfactant in the production of the film 7.

INDUSTRIAL APPLICABILITY

The polymer layer in the film of the present invention is excellent in TFE polymer properties such as heat resistance and electrical properties and further has UV processability, low moisture absorption and adhesion. Accordingly, the metal-clad laminate containing the film is useful as processed into an antenna member, a printed board, an aircraft member, an automobile member, etc. A metal conductor coated with the film exhibits high insulating properties over a long period of time and is suitably used for aerospace electric wires and electric wire coils.

REFERENCE SYMBOLS

1: Film, 4: copper foil, 5: through hole, A: double-sided copper clad laminate.

What is claimed is:

1. A film comprising an aromatic polyimide base film, and a layer containing (i) a polymer having units based on tetrafluoroethylene and units based on a perfluoro(alkyl vinyl ether) and (ii) an aromatic polymer, formed on each side of the base film,
wherein in the layer, an amount of the aromatic polymer (ii) to a total amount of the polymer (i) and the aromatic polymer (ii) is 10 mass % or less.

2. The film according to claim 1, wherein the base film and each layer are directly in contact with each other.

3. The film according to claim 1, wherein the polymer is a polymer having units based on tetrafluoroethylene and units based on a perfluoro(alkyl vinyl ether), and having a polar functional group, or a polymer having units based on tetrafluoroethylene and units based on a perfluoro(alkyl vinyl ether) in a proportion of the units based on a perfluoro(alkyl vinyl ether) of from 2.0 to 5.0 mol % to all units, and having no functional polar group.

4. The film according to claim 1, wherein the aromatic polymer is an aromatic polyimide.

5. The film according to claim 1, wherein polar functional groups are present at the surface of the layer.

6. The film according to claim 1, wherein the film has a thickness of 25 μm or more, and the ratio of the total thickness of the two layers to the thickness of the base film is 1 or more.

7. The film according to claim 1, which has a water absorption coefficient of 0.1% or lower.

8. The film according to claim 1, which has an optical absorption coefficient at a wavelength of 355 nm of 50% or higher.

9. The film according to claim 1, which has a loss tangent of less than 0.003.

10. A metal-clad laminate, comprising the film as defined in claim 1, and a metal foil bonded to each side of the film.

11. A coated metal conductor, comprising a metal conductor, and the film as defined in claim 1 formed to coat the metal conductor.

12. A method for producing a film, which comprises applying a powder dispersion containing a powder of a polymer having units based on tetrafluoroethylene and units based on a perfluoro(alkyl vinyl ether), an aromatic polymer or its precursor, and a liquid medium, to the surface of an aromatic polyimide base film, followed by heating to form a layer, thereby to obtain a film having the layer formed on each side of the base film, wherein in the layer, an amount of the aromatic polymer to a total amount of the polymer having units based on tetrafluoroethylene and units based on a perfluoro(alkyl vinyl ether) and the aromatic polymer is 10 mass % or less.

13. The production method according to claim 12, wherein the powder dispersion further contains a thermally decomposable nonionic surfactant.

14. The production method according to claim 12, wherein heating is conducted in an atmosphere containing an oxygen gas to form the layer.

* * * * *